United States Patent
Zech et al.

(10) Patent No.: US 10,260,863 B2
(45) Date of Patent: Apr. 16, 2019

(54) INTERFEROMETRIC DISPLACEMENT SENSOR FOR INTEGRATION INTO MACHINE TOOLS AND SEMICONDUCTOR LITHOGRAPHY SYSTEMS

(71) Applicant: attocube systems AG, München (DE)

(72) Inventors: Martin Zech, Finsing (DE); Klaus Thurner, München (DE)

(73) Assignee: attocube systems AG, Munich (DE)

( * ) Notice: Subject to any disclaimer, the term of this patent is extended or adjusted under 35 U.S.C. 154(b) by 0 days.

(21) Appl. No.: 15/307,581

(22) PCT Filed: Apr. 29, 2015

(86) PCT No.: PCT/EP2015/000872
§ 371 (c)(1),
(2) Date: Oct. 28, 2016

(87) PCT Pub. No.: WO2015/165587
PCT Pub. Date: Nov. 5, 2015

(65) Prior Publication Data
US 2017/0045353 A1    Feb. 16, 2017

(30) Foreign Application Priority Data
Apr. 30, 2014    (DE) .......... 10 2014 006 305

(51) Int. Cl.
*G01B 11/02*    (2006.01)
*G01B 11/14*    (2006.01)
(Continued)

(52) U.S. Cl.
CPC ............ *G01B 11/14* (2013.01); *G01B 9/0205* (2013.01); *G01B 9/02015* (2013.01); *G03F 7/70775* (2013.01)

(58) Field of Classification Search
CPC ........ G01B 11/14; G01B 11/026; G01B 9/02; G01B 9/02015; G01B 9/0205;
(Continued)

(56) References Cited

U.S. PATENT DOCUMENTS 5,617,440 A    4/1997 Meier
5,919,383 A *  7/1999 Beguin .................... H05K 7/20
                                                 219/209
(Continued)

FOREIGN PATENT DOCUMENTS

DE    3616393 C1    7/1987
DE    3706635 C2    9/1988
(Continued)

OTHER PUBLICATIONS

Schott, et al., Precision with Laser Light: Miniature Interferometer with Retroreflector—Set Standards in the Highly accurate Measurements of length, [online] Laser + Photonik. Apr. 2003. pp. 31-33. [recherchiert am Dec. 16, 2014]. <http://www.sios.de/DEUTSCH/ZEITSCHRIFTEN/MI%20LASER+PHOTONNIK%202003.PDF>.
(Continued)

*Primary Examiner* — Michael P LaPage
*Assistant Examiner* — Jonathon Cook
(74) *Attorney, Agent, or Firm* — Abelman, Frayne & Schwab

(57) ABSTRACT

Interferometer (10) for the real-time measurement of absolute distances and/or relative position movements between a first and a second machine part, comprising a measurement unit (20) and a reflector unit (40).
wherein the measurement unit (20) comprises a housing (21) with at least one wall made of heat-conducting material, wherein several measurement elements are arranged in the housing (21),
(Continued)

Figure 1:
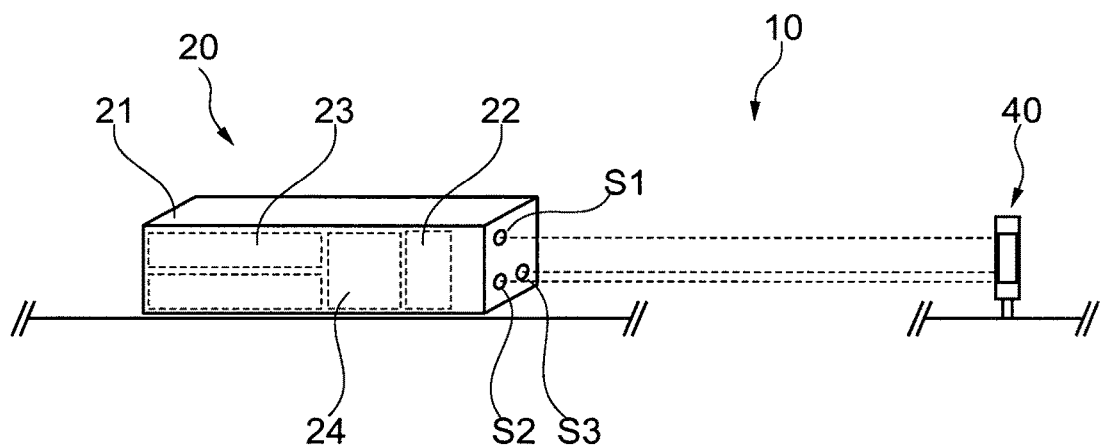

wherein the measurement elements comprise:
a laser source (22), a Peltier element (24) and a digital control (23)
wherein the measurement elements are thermally coupled to the wall of the housing (21) made of heat-conducting material.

13 Claims, 5 Drawing Sheets

(51) Int. Cl.
    *G01B 9/02*     (2006.01)
    *G03F 7/20*     (2006.01)

(58) Field of Classification Search
    CPC ............ G01B 9/02019; G01B 9/02055; G01B 9/02062; H05K 5/0004; H05K 5/0213; H05K 5/04; G03F 7/70775
    USPC ........................................................ 356/498
    See application file for complete search history.

(56) References Cited

U.S. PATENT DOCUMENTS

| | | | |
|---|---|---|---|
| 6,009,712 A | 1/2000 | Ito et al. | |
| 6,399,940 B1 | 6/2002 | Cui et al. | |
| 6,844,936 B2* | 1/2005 | Dalhoff | G01B 9/02045 |
| | | | 356/498 |
| 7,118,292 B2 | 10/2006 | Miao et al. | |
| 7,232,264 B2 | 6/2007 | Kropp et al. | |
| 7,529,285 B2 | 5/2009 | Meier | |
| 7,832,944 B2* | 11/2010 | Hosking | G02B 6/4201 |
| | | | 361/831 |
| 2002/0093663 A1* | 7/2002 | Tsai | G11B 5/5552 |
| | | | 356/498 |
| 2005/0138934 A1 | 6/2005 | Weigert et al. | |
| 2005/0146727 A1* | 7/2005 | Hill | G01B 9/02019 |
| | | | 356/498 |
| 2013/0063715 A1* | 3/2013 | Boeckem | G01C 15/002 |
| | | | 356/51 |
| 2013/0250307 A1* | 9/2013 | Tamiya | G01B 9/02015 |
| | | | 356/498 |
| 2014/0098375 A1* | 4/2014 | Liesener | G01B 9/02044 |
| | | | 356/498 |

FOREIGN PATENT DOCUMENTS

| | | |
|---|---|---|
| DE | 4306756 A1 | 9/1994 |
| DE | 4322723 A1 | 1/1995 |
| WO | 2003069744 A1 | 8/2003 |

OTHER PUBLICATIONS

German application No. DE 10 2014006305.4—Office Action dated Mar. 7, 2017.

* cited by examiner

INTERFEROMETRIC DISPLACEMENT SENSOR FOR INTEGRATION INTO MACHINE TOOLS AND SEMICONDUCTOR LITHOGRAPHY SYSTEMS

CROSS REFERENCE TO RELATED APPLICATION

This application claims benefit under 35 U.S.C. § 371 to international application No. PCT/EP2015/000872, filed on Apr. 29, 2015, which claims priority to German patent application numbers DE 102014006305.4, filed on Apr. 30, 2014, the contents of which are incorporated by reference herein in their entireties.

The invention relates to an interferometer, in particular an interferometer that can be used as a displacement sensor for integration into machine tools, in particular into semiconductor lithography systems. In addition, the invention relates to an optical length measuring system for measuring absolute distances and/or relative position movements between a first and a second machine part.

Length measuring systems for measuring a one-dimensional relative movement between a first and a second machine part are sufficiently known and are used nowadays in a large number of machines, in particular for measuring the relative position of machine head and machine bed in cutting or grinding machines or for measuring the relative position of sensor head/exposure head with respect to a sample carriage as often used in electron microscopy or semiconductor lithography.

Due to the steadily growing requirements for repeat and absolute accuracy and robustness, the optical glass scale has become established, which consists of a measurement head and a glass scale with a grating with known grating periodicity applied thereto, and which contactlessly determines relative movements between measurement head and scale. Typical grating periodicities nowadays are 10-20 μm, whereby it is possible here to achieve a position resolution of down to one nanometer (nm) with suitable electronic interpolation. In DE10262008B4 a length measuring system with a glass scale is described.

For a few years, holographic gratings have also been obtainable, which have a smaller periodicity (<1 μm) than the conventional glass scale and thus offer increased resolution, typically in the region of 0.1 nm. In DE4128595B4 a hologram scale is described.

Magnetic scales, as described for example in DE19729312A1, are a cost-effective alternative to the optical measuring systems, but due to their lower accuracy are mainly used in the automotive sector, but not in highest-precision manufacturing or lithography.

The object of the present invention was therefore to provide a real-time length measuring system with improved properties, in particular with higher accuracy, with more application possibilities also with more than one degree of freedom, with a reduced need for external calibration, an increased bandwidth of the measurement, a reduced installation space or suitability for directly measuring the movement of a machine tool such as for example a drill or a milling cutter.

The object of the invention is achieved with a device according to claim 1. Advantageous embodiments are given in the dependent claims.

In particular, the object is achieved by an interferometer for the real-time measurement of absolute distances and/or relative position movements between a first and a second machine part, comprising a measurement unit preferably combinable with the first machine part and a reflector unit preferably combinable with the second machine part, wherein the measurement unit comprises a housing with at least one wall made of heat-conducting material, wherein several measurement elements are arranged in the housing, wherein the measurement elements comprise: a laser source, in particular a DFB laser, a Peltier element and a digital control, preferably an FPGA control, wherein the measurement elements are thermally coupled to the wall of the housing made of heat-conducting material.

By using an interferometer for the real-time measurement of absolute distances or of relative position movements between two machine parts, it is possible to achieve a very much higher degree of accuracy in determining the distances or relative movements—thus the intrinsic restriction of the absolute accuracy of the glass scale can in principle be overcome by laser interferometry. While in the state of the art interferometry has, as a rule, only been used for calibrating machines, the movement or the distance between two machine parts can now be measured according to the invention in real-time operation by the interferometry measurement, with very much higher absolute accuracy than is possible with the glass scale or the hologram scale. Real-time operation here allows the sensor to be incorporated into the machine control and thus allows a closed control circuit with the actuator(s) located in the machine.

The measurement of the absolute distances here is preferably achieved in that the digital control, in particular an FPGA control, periodically adjusts the wavelength of the laser, in particular of a DFB laser, by means of the Peltier element (thermal change in wavelength) wherein the interference signal is continuously measured and analyzed by the FPGA control during this. With knowledge of the wavelength variation dLambda, the basic wavelength Lambda, and the apparent position change dx, the working distance "x" between measurement head and reflector can here be determined according to dLambda/Lambda=dx/x. The precise determination of the wavelength Lambda and the modulation amplitude dLambda is here carried out by analysis of the transmission signal of a molecular absorption cell. The wavelength is here preferably modulated to the extent that several absorption minima of the molecular absorption cell are covered (corresponding to a dLambda of several nanometers). Knowledge of the wavelength/position of the absorption minima of the gas cell allows the precise determination of dLambda and Lambda, and thus a direct calculation of the absolute distance "x".

The object is achieved according to the invention in that, without active cooling, the measurement elements are cooled by convection in that they are coupled to the heat-conducting outer wall of the housing. In the state of the art, there was a preconception that due to the high temperature sensitivity of the interferometry measurement, active cooling was indispensable. By avoiding active cooling by means of the thermal coupling of the heat-developing measurement element within the measurement unit and cooling via convection, a construction has been provided which for the first time allows the use of an interferometer in the real-time measurement of absolute distances or of relative position movements between two machine parts. This makes it possible for the first time to construct the interferometer so that it is ultra-compact and advantageously develop it so that it is also hermetically shielded against environmental influences, and thus to obtain the possibility of mounting the interferometer or the measurement unit on the one hand and the reflector unit on the other hand on two machine parts and by this means to measure the movement or the distance between these machine parts in real time. Thus the interferometer according to the invention can be integrated into machines, for example into coordinate measuring machines (CMM), attached to industrial top hat rails of the standard DIN EN 60715 or flange-mounted on electric motors, combustion engines, or gas turbines.

The interferometer consists of a measurement unit and a reflector unit. The measurement unit preferably attached to the first machine part, or the basic module, contains in particular the optical components for producing the measuring beam, which is then directed onto the reflector unit preferably attached to the second machine part and the reflected beam thereof is then evaluated by further components of the measurement unit, with the result that the absolute distance and/or also a change in distance between the measurement unit and the reflector unit—and thus between the first and the second machine part—can be determined by means of interferometry in real time. The interferometer preferably consists of an optoelectronic sensor head or fibre-coupled measurement head firmly connected to the first machine part and several reflector units firmly connected to the second or further machine parts.

The reflector unit consists of an optical element which can at least partially reflect the radiation emitted by the measurement unit. The optical reflector unit can preferably comprise plane mirrors, retroreflectors or also machined materials. The optical reflectivity can here preferably cover a wide range whereby both uncoated glasses (reflectivity of ~4%) and also materials with high reflectivity such as metals (reflectivity>90%) can be used as reflectors. Silicon is also particularly suitable as a reflector material (reflectivity of ~40%). The reflector unit can thus also preferably be for example a polished surface or a surface of a specific quality on the machine part itself.

The housing preferably has at least one wall made of heat-conducting material, with the result that heat can be released to the ambient air via this wall. A material with a heat conductivity lambda of more than 30 W/(m·K) at 0° C., in particular of more than 100, particularly preferably of more than 150, preferably of more than 200, particularly preferably of more than 230, is preferably suitable as heat-conducting material. At 0° C. in dry conditions the heat conductivity is 236 in the case of aluminium, 314 in the case of gold, 429 in the case of silver, 401 in the case of pure copper, 240-380 in the case of commercial copper, 120 in the case of brass, 167 in the case of tungsten and 85 in the case of nickel. One of these materials or a combination of these materials is preferably used as heat-conducting material. Aluminium or an aluminium alloy is particularly preferably used.

The housing is preferably formed hermetically shielded against environmental influences. As, due to the cooling via convection, active cooling is no longer required, ventilation openings in the housing can be dispensed with and a hermetic shielding of the housing against environmental influences can thereby be achieved. Shielding by a type of protection according to protection class IP54 to IP67 can thus preferably be achieved. The type of protection indicates the suitability of electrical equipment (for example devices, lights and installation material) for various environmental conditions, in addition to the protection of human beings against potential danger during the use thereof.

The measurement elements comprise in particular a laser source, preferably a DFB laser and a Peltier element. DFB lasers (distributed feedback lasers) are laser diodes in which the active material is structured periodically. The structures of variable refractive index form a one-dimensional interference grating or interference filter (Bragg mirror). The interference leads to wavelength-selective reflection and forms the optical feedback of the laser. The laser source is preferably provided by a DFB laser which is realized in a wavelength-stabilized manner, via a gas cell, in particular a molecular absorption cell.

With the Peltier element the temperature of the laser can be adjusted for the purpose of wavelength tuning.

Particularly preferably, the DFB laser is realized together with an integrated Peltier element in a laser diode, particularly preferably as a butterfly laser diode.

Furthermore the measurement elements preferably comprise a digital control, preferably an FPGA control. A field programmable gate array (FPGA) is an integrated circuit (IC) of digital technology, into which a logic circuit can be programmed.

In addition, the measurement elements can preferably comprise an AD/DA converter, preferably consisting of an analog-digital converter and a digital-analog converter and/or a voltage regulator module, preferably one or more point of load regulators. These measurement elements are preferably also—individually or all—thermally coupled to the wall of the housing.

The measurement elements are thermally coupled to the wall of the housing made of heat-conducting material. The heat of the measurement elements is thereby released to the ambient air via the outer wall of the housing. Particularly preferably the housing is mounted on a further part in flat contact, for example the housing is attached to the first machine part or it is accommodated in a control cabinet in flat contact with a cooling block. Due to contact of the outer wall of the housing with this further part, the heat from the wall of the housing can be released to the further part. Particularly preferably, a heat-conducting foil is applied to the housing, which heat-conducting foil is also in contact with the further part and thus ensures that the heat is conducted away from the wall of the housing via the heat-conducting foil into the further part. Heat-conducting foil outside and inside/heat-conducting pads/heat-conducting paste.

In a further embodiment example of the present invention, an interferometer is provided, wherein the measurement unit comprises a remote measurement head which is coupled to the measurement unit by means of an optical waveguide. The beam guidance of the interferometer can thus take place both by free beam guidance and fibre-based.

In the basic design, the interferometer according to the present invention can be used in the free beam measurement process. In the process, the measurement beam is coupled out of the housing of the measurement unit via a sensor output and directed through the air onto the reflector unit. In the embodiment described here, a remote measurement head is (additionally) provided, which is connected to the measurement unit via an optical conductor and conducts the measurement beam from the measurement unit into a measurement head remote from the measurement unit. The measurement beam is then directed from this measurement head onto the reflector unit and the reflected radiation is also detected again. The remote measurement head is preferably coupled to the measurement unit by means of an optical waveguide, in particular a glass fibre cable. This fibre-based measurement requires, in a known manner, compensation of the optical effects occurring in the optical waveguide. The optical waveguide can have a length of up to 100 m, preferably up to 1000 m, particularly preferably up to 5000 m.

Particularly preferably, in one measurement unit several measurement beams can be used in parallel, particularly preferably via a number n of sensor outputs. The number n is preferably 1, 2, 3, 4, 5, 6, 7, 8, 9 or 10. Embodiments with 20, 30 or 40 are also conceivable. These sensor outputs can be realized in the free beam process or fibre-coupled as remote measurement heads. Particularly preferably sensor outputs are provided both for the free beam process and for the coupling of remote measurement heads. Three sensor outputs are preferably provided, particularly preferably three sensor outputs for the free beam process. Further preferably, three sensor outputs for fibre-coupled measurement heads are provided. Further preferably, three sensor outputs for the free beam process are provided, as well as one, two or three further fibre-coupled measurement heads. It is thus possible, in addition to an absolute distance measurement, also to determine a pitch, yaw and/or roll angle between two machine parts as well as a displacement between the workpieces in x and y direction (wherein the z direction is intended to denote the distance between the machine parts). Furthermore, it is possible, in particular through the use of the remote fibre-based measurement heads, to measure several machine parts and their movement behaviour in relation to each other, i.e. also more than two machine parts. An optical length measurement system is thus provided for measuring absolute distances and relative position movements between a first and a second machine part, or between a first and a plurality of machine parts, or between several machine parts in relation to each other, as well as the machine vibrations and guidance errors—in particular angle errors—relative to the first machine part occurring during the operation of one or more machine parts.

In a further embodiment example of the present invention, an interferometer is provided, wherein the measurement elements comprise fibre-optic components and miniaturized digital electronics, for example as used in telecommunication technology, in particular the measurement elements comprise an interface board, a field programmable gate array (FPGA) board, a laser board and an optics board. A miniaturized design of the measurement unit of the interferometer is hereby possible. It is preferably provided to realize a combination of several of the claimed boards on one board. Particularly preferably, standardized fibre-optic components from telecommunications are used. The laser source is preferably a DFB laser which is designed wavelength-stabilized via a gas cell. The stabilization of the wavelength here takes place preferably up to 50 ppb.

Communication between the sensor heads and the boards preferably takes place here by fibre optics. Communication between the remaining boards takes place electrically, analog or digital.

The FPGA control is preferably formed as an FPGA board and allows data acquisition and processing in real time. The FPGA board preferably contains an FPGA with rapid clock speed, in particular with a clock speed of more than 70 MHz, a quad analog-to-digital converter, as well as a plurality of digital-to-analog converters. The FPGA board here is the calculation centre of the interferometer, which not only computes the simultaneous determination of the positions/angles of all the axes in real time, but is also responsible for a plurality of further tasks. The FPGA board is preferably also responsible for the stabilization of the wavelength of the DFB laser, which is preferably located on a laserboard, via a molecular absorption cell preferably located in an optics board. In addition the FPGA board is preferably also responsible for the thermal regulation of the DFB laser via a Peltier element preferably located on the laser board as well as the modulation/demodulation of the laser wavelength for producing a quadrature signal or the dynamic adjustment of filter properties and system parameters as a function of the movement speed and of the distance of the second machine part and the reduction of periodic nonlinearities to less than 1 nanometer. Furthermore, system and interface parameters can be adjusted by means of a web interface or an internet interface, via a processor situated on the FPGA board.

By a clock speed of the FPGA of 50 MHz, particularly preferably of 80 MHz, it is possible to achieve a latency period of less than 500 ns. A real-time evaluation is thereby made possible. Particularly preferably, calculation steps are carried out in parallel in the FPGA, in particular with software pipelining—this is used for the parallel processing of commands of a single thread.

The laser board is essentially responsible for the signal generation and detection and preferably contains a fibre-coupled DFB laser source for the production of coherent laser light necessary for the interferometry, further preferably a Peltier element and further preferably a temperature sensor for temperature control of the laser, and further preferably four or more photodetectors and preferably also associated amplifier circuits. Preferably three (or more) photodetectors are responsible here for the measurement of the interference intensities of the three (or more) sensor outputs, wherein a further photodetector determines the transmission signal of a molecular absorption cell preferably situated in the optics board.

The optics board is responsible for the signal routing and also preferably contains, in addition to a plurality of fibre couplers and isolators, a molecular absorption cell which is used for the wavelength stabilization. The optics board is, furthermore, preferably connected to the sensor outputs or the external or remote sensor or measuring heads by means of fibre optics.

The interface board allows real-time data communication with peripheral devices via modern real-time interfaces. Interfaces for the field buses typical in the industry (CAN, Profinet, Profibus, Ethercat) and preferably also Ethernet as well as particularly preferably digital real-time protocols are preferably integrated here, such as e.g. AquadB and proprietary serial protocols. Analog sine/cosine signals (quadrature signals) for position transfer can also be output via the same interfaces. Further preferably, a further connector is provided for the connection of an environmental compensation unit—this allows the determination of the optical refractive index predominant in the ambient air, which allows an absolute accuracy of the laser interferometer better than 1 ppm (parts per million) in ambient conditions. Thus there are various position output possibilities via the interface board. In particular this comprises digital ABquer, digital serial and analog sin/cos interfaces, as well as the field buses usual in industry (CANopen, CAN, Profibus, Profinet, Ethercat, SPI). Particularly preferably a web interface is provided. This allows easy configuration of the mechanics, determination of the signal quality/strength of the sensor, and also adjustment of all the interface parameters.

In a further embodiment example of the present invention, an interferometer is provided, wherein the housing has external dimensions of less than 75 mm×75 mm×200 mm, preferably of less than 50 mm×50 mm×165 mm. Particularly preferably, the volume of the housing with its external dimensions is less than 0.001125 m^3, in particular less than 0.0004125 m^3.

In a further embodiment example of the present invention, an interferometer is provided in which the housing has an enlarged surface, in particular cooling ribs, in at least one region, which promotes thermalization with the surrounding air masses.

By the provision of an enlarged surface, in particular in the region of the housing at the outer surface in which a measurement element is arranged on the inside of the housing wall, the heat transfer to the surroundings of the housing is promoted. Particular preferably, cooling ribs are provided on the outside of the housing. These cooling ribs are preferably designed integrated with the housing. A heat exchange, i.e. thermalization with the surrounding air masses, is thereby advantageously achieved.

In a further embodiment example of the present invention, an interferometer is provided, wherein a threaded bushing is provided on the outside of the housing. The threaded bushing is preferably attached at a distance "d" from the front end of the housing, which corresponds to the focal length "f" of the collimators and thus reduces the influence of thermal fluctuations on the distance or position measurement—in the case of a measurement by means of a free beam—to a minimum.

As an alternative to threaded blind holes, slots can also be pressed into the housing profile, which allow fixing to a first machine part by means of slot nuts Adapter plates are preferably mounted onto the housing, which preferably allow fixing to top hat rails of the standard DIN EN 60715. In this case the interferometer is preferably mounted in a control cabinet, the sensor heads actuated via light guides.

In a further embodiment example of the present invention, an interferometer is provided, wherein the reflector unit comprises at least one optical reflector, preferably at least three optical reflectors.

The number of sensor outputs, whether for a free beam or a fibre-coupled measurement head, corresponds to the number of reflectors which are fixed to the second machine part. These reflectors can be formed individually or a number of individual reflectors on a common support or also a larger reflecting surface which serves as reflector for different measurement beams. Thus it is for example possible that three measurement beams are directed onto a reflector surface on the front end of the second machine part and the areas where the measurement beams impinge on this reflector surface are separated from each other by a predetermined distance d1, d2, d3. Thus by measuring the distance between these three measurement points on the reflector surface with d1, d2 and d3 being known, it is possible to determine, besides the distance, also the yaw and pitch angle (tilting) of the second machine part with respect to the first machine part.

There are thus preferably several fundamental measurement modes. In particular these are the incremental measurement of a linear position change, the incremental measurement of one or more angle changes due to the use of two or more measurement beams which are at a known distance and angle with respect to each other, as well as the measurement of an absolute position distance between measurement head and reflector by controlled variation of the wavelength of the laser source and analysis of the resulting interference pattern.

In a further embodiment example of the present invention, an interferometer is provided in which the digital control, preferably the Field Programmable Gate Array, is configured to carry out a position determination of the reflector unit and/or a temperature and wavelength regulation. By a rapid clock speed of the FPGA and/or by parallel calculation of position information, the bandwidth of the position determination can be very significant, such that it can be up to 100 MHz. The resolution of the position change is thus, depending on light wavelength, up to 1 picometer ($10^{-12}$ m).

In a further embodiment example of the present invention, an interferometer is provided, wherein the interferometer is provided with three measurement axes, preferably with 5 measurement axes, particularly preferably with 7 measurement axes.

These can be designed both as free beam, and also with measurement heads situated at a distance, which can be optically actuated and read out by means of a glass fibre.

The basic module here typically has three measurement axes or also a larger number of measurement axes which makes it possible, when measuring the relative movement between a first and a second machine part, both to determine the absolute and relative distance and also the tilting about the vertical axis (yaw) and about the transverse axis (pitch).

In a further embodiment example of the present invention, an interferometer is provided, wherein a device is additionally provided for compensation of the (for example environmentally determined) variation in the refractive index of the air. For this, a device is preferably provided for the connection of further electronics (external or integrated in the housing) which compensates for the variation in the refractive index of the air on the length of the measurement section by measuring the air pressure, the air temperature or the air humidity.

The object of the invention is also achieved by an optical length measurement system for measuring absolute distances and/or relative position movements between a first and a second machine part consisting of an optoelectronic measurement unit of an interferometer according to the invention (firmly) connected to the first machine part or a remote measurement head (firmly) connected to the first machine part, which measurement head is fibre-coupled to a measurement unit of an interferometer according to the invention and at least one reflector unit (firmly) connected to the second machine part.

An optical length measurement system is thereby provided for real-time measurement between a first and a second machine part or a plurality of machine parts or between several machine parts in relation to each other, as well as the machine vibrations and guidance errors—in particular angle errors—occurring during the operation of one or more machine parts relative to the first machine part.

Figure 2:
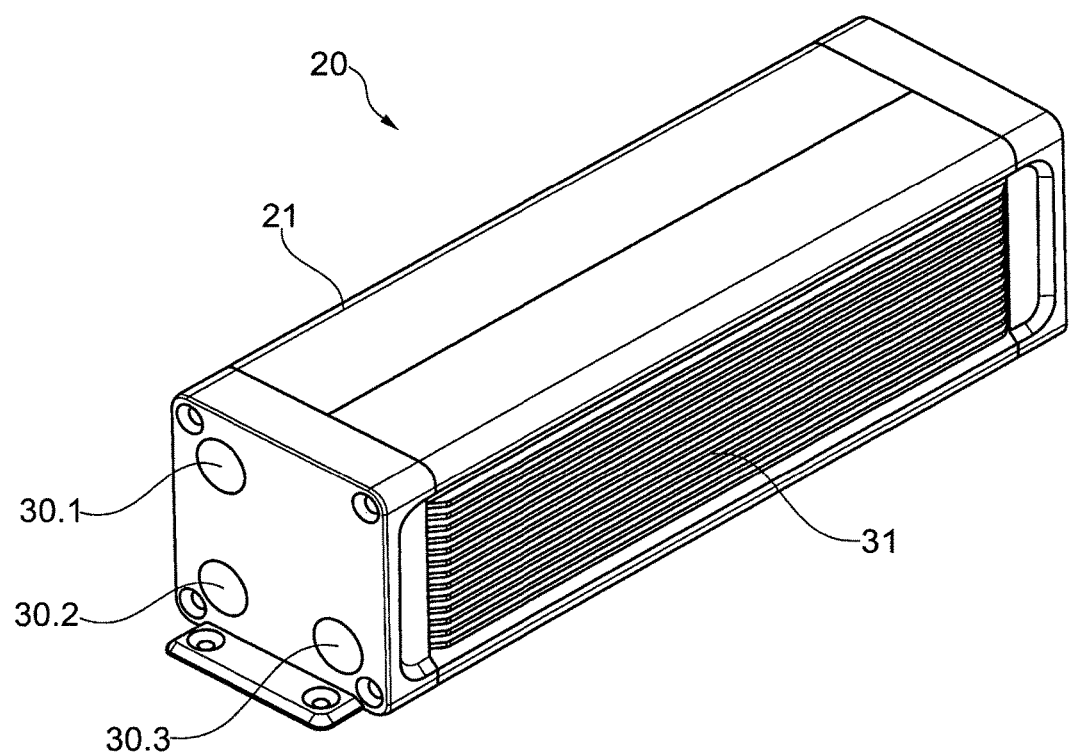
Figure 3:
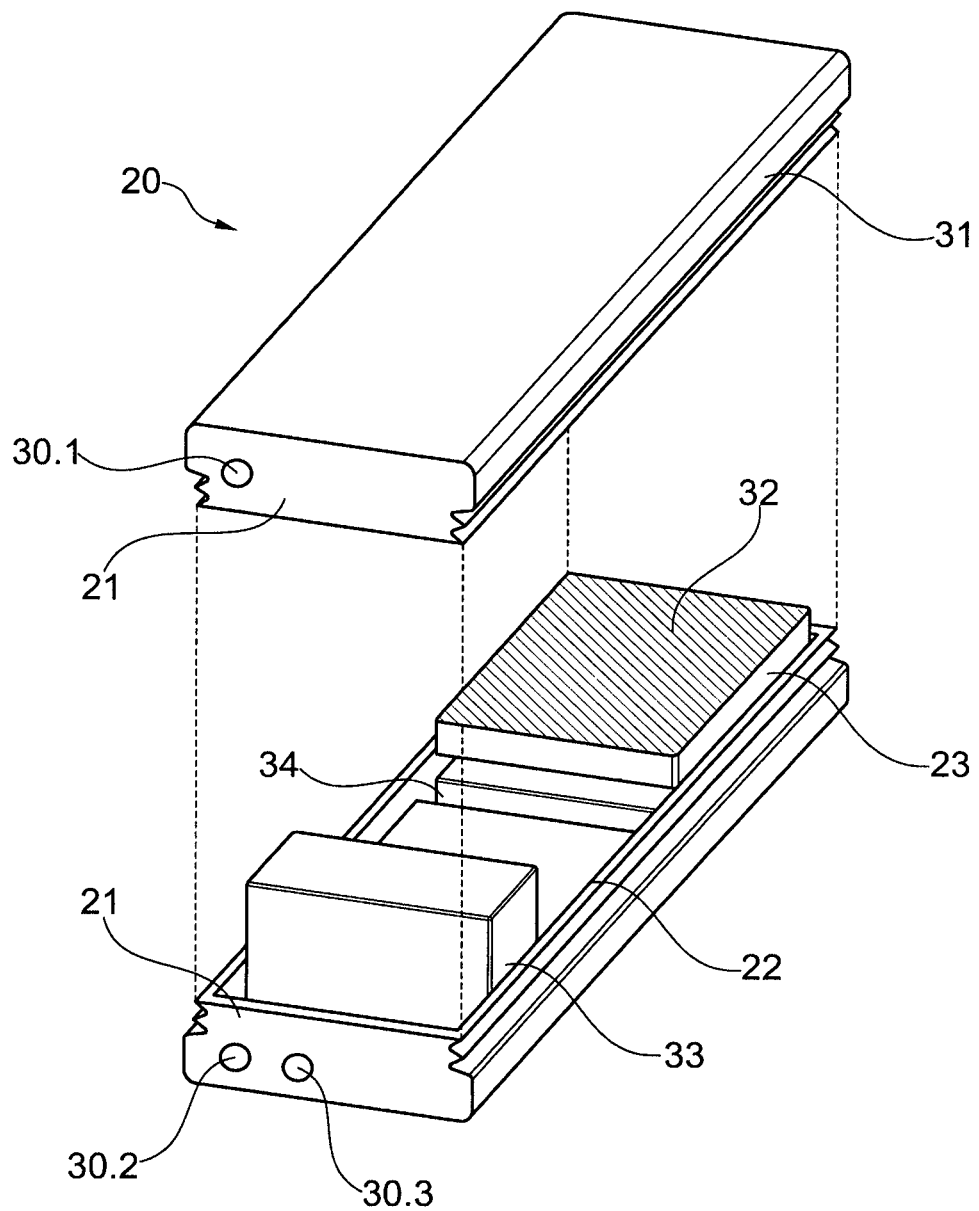
Figure 4:
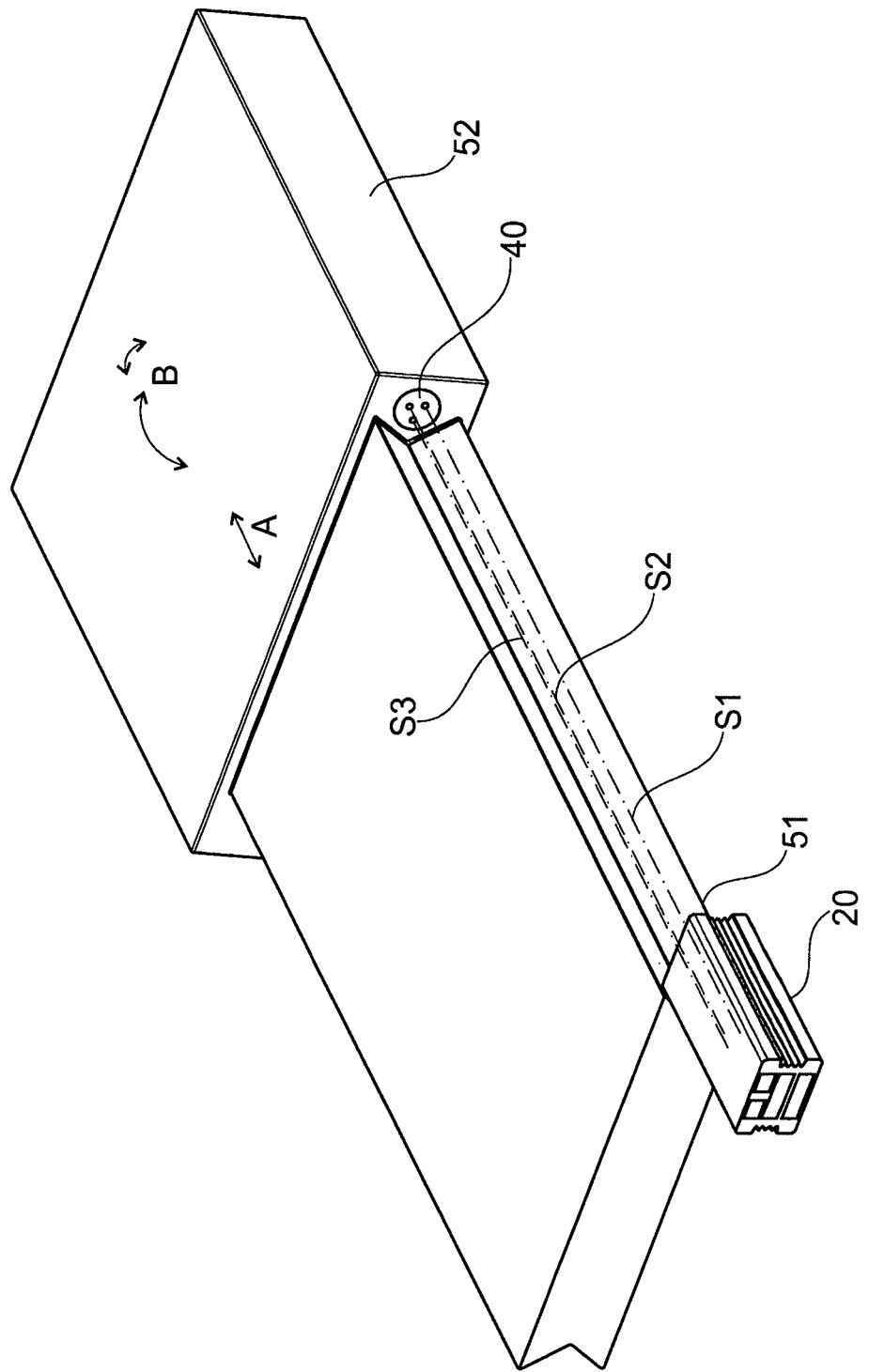
Figure 5:
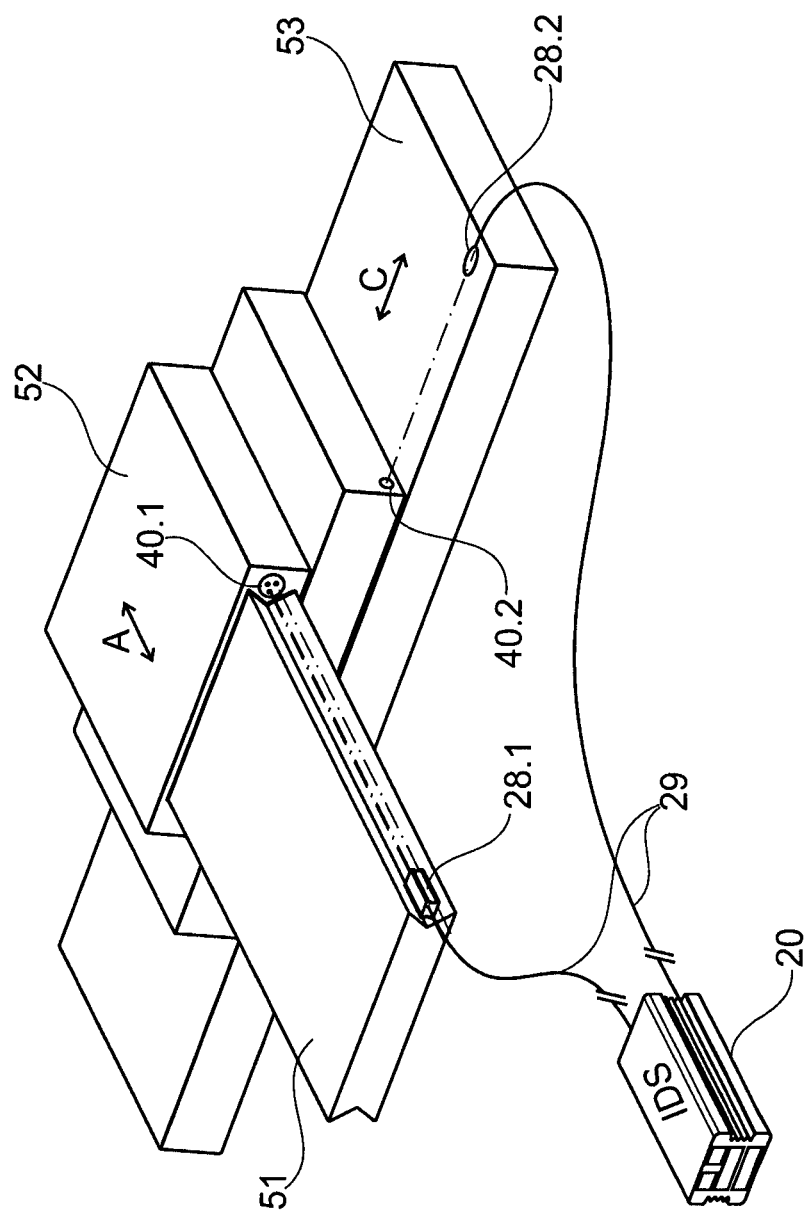

Further advantageous embodiments are shown in the figures. The figures show:

FIG. 1 a schematic representation of an interferometer according to the invention;

FIG. 2 a closed top view of an embodiment example of the measurement unit according to the present invention;

FIG. 3 an open top view of an embodiment example of the measurement unit according to the present invention;

FIG. 4 a first embodiment example of an optical length measurement system for real-time measurement between a first and a second machine part and FIG. 5 a second embodiment example of an optical length measurement system for real-time measurement between a first, a second and a third machine part.

FIG. 1 shows a schematic representation of an interferometer 10 according to the invention. The interferometer 10 comprises a measurement unit 20 as basic module and a reflector unit 40 remote therefrom. The measurement unit 20 consists of a housing 21, in which a laser source 22, a digital control 23 and a Peltier element 24 are accommodated. The laser source 22, the digital control 23 and the Peltier element 24 are thermally coupled to the inside of the wall of the housing 21, in that they are adhered to the housing by means of a heat-conducting foil.

Via three outlets in the front end of the housing 21, three measurement beams S1, S2 and S3 can be directed from the measurement 20 onto the reflector unit 40. The beams reflected from there are detected by the measurement unit 20 and evaluated via the digital control 23 in real time.

This makes it possible to record relative movements and/or absolute distances between the measurement module 20 and the reflector unit 40 in real time.

FIG. 2 shows a closed top view of an embodiment example of the measurement unit 20 according to the present invention. The housing 21 has cooling ribs 31 which are arranged on the long side of the housing 21. On the front end of the housing 21 three sensor outputs 30.1, 30.2 and 30.3 are arranged, via which the measurement beams can be coupled out of the measurement unit and the reflected radiation detected.

FIG. 3 shows an open top view of an embodiment example of the measurement unit 20 according to the present invention. The housing 21 has the cooling ribs 31 and the sensor outputs 30.1, 30.2 and 30.3 as in FIG. 2. Furthermore, an optical board 33 as well as a laser board 22 (with Peltier element—not shown separately) can be recognized in the housing 21. In addition, a digital control is shown as FPGA 23, which is arranged over an interface board 34. A contact with the wall of the housing is produced for the digital control 23 via a heat-conducting foil 32.

By the use of miniaturized electronic and optical components it is possible to reduce the size of the housing to below 50 mm×50 mm×165 mm (breadth×height×length). The heat-producing components (DFB-Laser 22, FPGA 23, Peltier element) are here thermally coupled to the housing 21 and the housing 21 itself is used as a heat sink (cooling via convection). Besides the named cuboid form, this design also allows other construction forms with comparable construction volumes (e.g. flatter design for use in control cabinets etc.)

FIG. 4 shows a first embodiment example of an optical length measurement system for real-time measurement between a first machine part 51 and a second machine part 52. The two machine parts 51, 52 are movable against one another via running slides in the direction of the arrow A. Movement errors such as pitch and yaw can occur along the arrow B. A measurement unit 20 is firmly screwed to the first machine part 51. The measurement unit directs three measurement beams S1, S2 and S3, onto a reflector unit 40 which is firmly connected to the second machine part 52. Due to the distance between the three measurement points and the reflector unit 40 it is possible to measure both a position change between the first machine part 51 and the second machine part 52 along the axis A, and also movement errors along the axis B. This measurement can take place in incremental manner (measurement of the relative movement) and also in absolute manner (measurement of the absolute distance or the absolute tilt angle).

FIG. 5 shows a second embodiment example of an optical length measurement system for real-time measurement between a first machine part 51, a second machine part 52 and a third machine part 53. The two machine parts 51, 52 are movable with respect to one another via running slides in the direction of the arrow A. The two machine parts 53, 52 are movable with respect to one another via running slides in the direction of the arrow C. A measurement unit 20 is connected to two fibre-coupled measurement heads 28.1 and 28.2 via optical waveguides 29. The measurement head 28.1 is attached to the first machine part 51 and aligned with a reflector unit 40.1 on the second machine part 52. The measurement head 28.2 is attached to the third machine part 53 and aligned with a reflector unit 40.2 on the second machine part 52. The measurement unit 20 is remotely accommodated in a control cabinet (not shown).

When the slides are moved in directions A and C, the remote measurement heads 28.1 and 28.2 now measure the relative movement or the absolute distances between the first 51 and second 52 or the second 52 and third 53 machine parts. The glass fibre 29 allows a connection of the measurement unit 20 in a remote space—this can be situated more than 1,000 m away from the measurement heads 28.1 and 28.2.

In this way an interferometer has been provided for the real-time measurement of absolute distances and/or relative position movements between a first and a second machine part, as well as an optical length measurement system for measuring absolute distances and/or relative position movements between a first and a second machine part, which avoids the disadvantages of the state of the art.

LIST OF REFERENCE NUMBERS

10 Interferometer
20 Measurement unit/basic module
21 Housing
22 Laser source
23 Digital control
24 Peltier element
25 Voltage regulator module
26 Device for compensation of the variation in the refractive index of the air
27 AD/DA converter
28 Remote (fibre-coupled) measurement head
29 Light waveguide
30 Sensor output
31 Cooling ribs
32 Heat-conducting foil
33 Optical board
34 Interface board
40 Reflector unit
50 Machine part
51 First machine part
52 Second machine part
53 Third machine part

The invention claimed is:

1. An optical length measuring system for measuring absolute distances and/or relative position movements between a first machine part and a second machine part, the optical length measuring system comprising an interferometer having an optoelectronic measurement unit and a reflector unit which includes at least one optical reflector;
the optoelectronic measuring unit including a housing with at least one wall made of heat-conducting material, the heat-conducting material having a heat conductivity lambda value of more than 30 W/(m·K) at 0° C., the housing having external dimensions of less than 75 mm×75 mm×200 mm, wherein several measurement elements are arranged in the housing, the measurement elements including a laser source, a Peltier element, and a digital control, wherein the measurement elements are arranged and thermally coupled directly to the at least one wall of the housing via a heat-conducting medium, the at least one wall being made of the heat-conducting material to facilitate cooling via convection, and the measurement elements including fibre-optic components and miniaturized digital electronics; and wherein the optoelectronic measurement unit includes a remote measurement head firmly connected to the first machine part, the remote measurement head being optically-coupled to the optoelectronic measurement unit via a light waveguide, and wherein the reflector unit is firmly connected to the second machine part.

2. The optical length measuring system according to claim 1, wherein the measurement elements comprise an interface board, a field programmable gate array (FPGA) board, a laser board and an optics board.

3. The optical length measuring system according to claim 1, wherein the heat-conducting material consists of one of the following materials or a combination thereof: aluminium, silver, copper.

4. The optical length measuring system according to claim 1, wherein the housing has external dimensions of less than 50 mm×50 mm×165 mm.

5. The optical length measuring system according to claim 1, wherein the housing has an enlarged surface, in particular cooling ribs, in at least a region, which promotes thermalization with the surrounding air masses.

6. The optical length measuring system according to claim 1, wherein the at least one optical reflector comprises at least three optical reflectors.

7. The optical length measuring system according to claim 1, wherein the digital control is configured to carry out a position determination of the reflector unit and/or a temperature and wavelength regulation.

8. The optical length measuring system according to claim 1, wherein the interferometer is provided with at least three measurement axes.

9. The interferometer according to claim 1, wherein a device is additionally provided for compensation of the variation in the refractive index of the air.

10. The optical length measuring system of claim 8, wherein the interferometer is provided with six measurement axes.

11. The optical length measuring system of claim 8, wherein the digital control is configured to determine a tilting, pitch, roll, yaw and a displacement between the first and second machine parts.

12. The optical length measuring system of claim 1, wherein the light waveguide is a fibre-optic cable.

13. The optical length measuring system of claim 1, wherein the remote head and reflector unit are configured to respectively send and reflect a beam of light therebetween.

* * * * *